US011322369B2

(12) United States Patent
Lee (10) Patent No.: US 11,322,369 B2
(45) Date of Patent: May 3, 2022

(54) POWDER PROTECTING THREE-WAY VALVE (71) Applicant: BOYA CO., LTD., Hwaseong-si (KR)

(72) Inventor: Jeong Cheol Lee, Suwon-si (KR)

(73) Assignee: BOYA CO., LTD., Hwaseong-si (KR)

( * ) Notice: Subject to any disclaimer, the term of this patent is extended or adjusted under 35 U.S.C. 154(b) by 107 days.

(21) Appl. No.: 16/765,073

(22) PCT Filed: Sep. 19, 2018

(86) PCT No.: PCT/KR2018/011041
§ 371 (c)(1),
(2) Date: May 18, 2020

(87) PCT Pub. No.: WO2019/103298
PCT Pub. Date: May 31, 2019

(65) Prior Publication Data
US 2021/0366733 A1 Nov. 25, 2021

(30) Foreign Application Priority Data
Nov. 22, 2017 (KR) .......................... 10-2017-0156637

(51) Int. Cl.
*H01L 21/67* (2006.01)
*F16K 11/087* (2006.01)
*F16K 27/06* (2006.01)

(52) U.S. Cl.
CPC .... *H01L 21/67017* (2013.01); *F16K 11/0876* (2013.01); *F16K 27/067* (2013.01)

(58) Field of Classification Search
CPC ............. F16K 11/0876; F16K 11/0873; F16K 11/087; F16K 27/067; F16K 49/002;
(Continued)

(56) References Cited

U.S. PATENT DOCUMENTS 2,661,926 A * 12/1953 Resek ................. F16K 11/0876
137/625.47
3,100,499 A * 8/1963 Bass .................... F16K 5/0668
137/246.22
(Continued)

FOREIGN PATENT DOCUMENTS

KR 10-0174086 B1 4/1999
KR 10-0324808 B1 2/2002
(Continued)

OTHER PUBLICATIONS

International Search Report for PCT/KR2018/011041 dated Jan. 3, 2019 from Korean Intellectual Property Office.

*Primary Examiner* — David Colon-Morales
(74) *Attorney, Agent, or Firm* — Paratus Law Group, PLLC (57) ABSTRACT Disclosed is a powder protecting three-way valve for a semiconductor or flat panel display manufacturing apparatus, including: a valve casing including an inlet and a plurality of outlets; a rotating ball rotatably installed in the valve casing to control a flow direction of reaction by-product gas; a nitrogen gas supply member which receives nitrogen gas from an outside, guides a flow of the nitrogen gas using a guide path, and supplies the nitrogen gas into the valve casing to prevent a powder contained in the reaction by-product gas from accumulating in the valve casing; and a heating unit installed in the nitrogen gas supply member to heat the nitrogen gas passing through an interior of the nitrogen gas supply member. The nitrogen gas supply member is formed as a thin flat body pressed against one side surface of the valve casing and is integrally coupled to the valve casing.

8 Claims, 9 Drawing Sheets (58) Field of Classification Search
CPC ........ F16K 5/0605; F16K 25/02; F16K 25/04; H01L 21/67017
See application file for complete search history.

(56) References Cited

U.S. PATENT DOCUMENTS

| | | | | |
|---|---|---|---|---|
| 3,345,032 A * | 10/1967 | Rawstron | ............ | F16K 11/0876 251/172 |
| 3,605,789 A * | 9/1971 | Graham | ................. | F16K 5/205 137/240 |
| 3,735,956 A * | 5/1973 | Matousek | ............ | F16K 11/0876 251/315.05 |
| 4,224,963 A * | 9/1980 | Stahle | ..................... | F16K 25/02 137/897 |
| 4,304,252 A * | 12/1981 | Stanton | ................ | F16K 5/0605 137/123 |
| 4,572,239 A * | 2/1986 | Koch | ................. | F16K 11/0876 137/625.47 |
| 4,685,488 A * | 8/1987 | Corbin | ................. | F16K 5/201 137/328 |
| 4,749,002 A * | 6/1988 | Lembser | ................. | F16K 25/02 137/246.22 |
| 5,842,683 A * | 12/1998 | Wei | ....................... | F16K 27/067 251/315.13 |
| 5,988,220 A * | 11/1999 | Sakaki | ................ | F16K 11/0876 137/625.22 |
| 6,578,598 B2 * | 6/2003 | Gardner | ................ | F16K 5/0605 137/240 |
| 7,363,935 B2 * | 4/2008 | Anderson | ........... | F16K 11/0876 137/271 |
| 8,051,870 B2 * | 11/2011 | Matsuura | ................ | F16K 25/02 137/15.04 |
| 10,400,900 B2 * | 9/2019 | Kindersley | ......... | F16K 11/0876 |
| 2009/0114296 A1 * | 5/2009 | Tsuda | .................... | F16K 49/002 137/613 |
| 2010/0327196 A1 | 12/2010 | Hill, Jr. et al. | | |
| 2015/0114487 A1 * | 4/2015 | Schneider | ............... | B61C 17/02 137/341 |

FOREIGN PATENT DOCUMENTS

| | | |
|---|---|---|
| KR | 10-2011-0016011 A | 2/2011 |
| KR | 10-2011-0043818 A | 4/2011 |

* cited by examiner

POWDER PROTECTING THREE-WAY VALVE

CROSS-REFERENCE TO PRIOR APPLICATIONS

This application is a National Stage Patent Application of PCT International Patent Application No. PCT/KR2018/011041 (filed on Sep. 19, 2018) under 35 U.S.C. § 371, which claims priority to Korean Patent Application No. 10-2017-0156637 (filed on Nov. 22, 2017), which are all hereby incorporated by reference in their entirety.

BACKGROUND

The present invention relates to a semiconductor or flat panel display manufacturing apparatus, and more particularly, to a powder protecting three-way valve which prevents a powder from being introduced into a gap between a rotating ball and a ball seat by supplying nitrogen gas in an air curtain form heated in an exhaust line of a semiconductor or flat panel display manufacturing apparatus so that the powder protecting three-way valve is usable for a long time period without damage and in which a member configured to heat and supply nitrogen gas is integrally and compactly provided instead of being separately provided as an independent member and an additional installation space is not needed.

Generally, semiconductor and flat panel display manufacturing processes mainly include fabrication processes and assembly processes, wherein the fabrication process includes processes for manufacturing semiconductor chips by repeatedly performing processes of depositing thin films on a wafer in various kinds of chambers and selectively etching the deposited thin films to form particular patterns, and the assembly process includes processes for assembling finished devices by individually separating the chips manufactured in the fabrication processes and connecting lead frames to the chips.

In this case, the process of depositing the thin film on the wafer or etching the thin film deposited on the wafer is performed in a process chamber using harmful gases such as silane, arsine, and boron chloride and process gases such as hydrogen at a high temperature, and while the process is performed, a large amount of reaction by-product gas containing various ignitable gas, corrosive foreign substances, and toxic components are generated in the process chamber.

Figure 1:
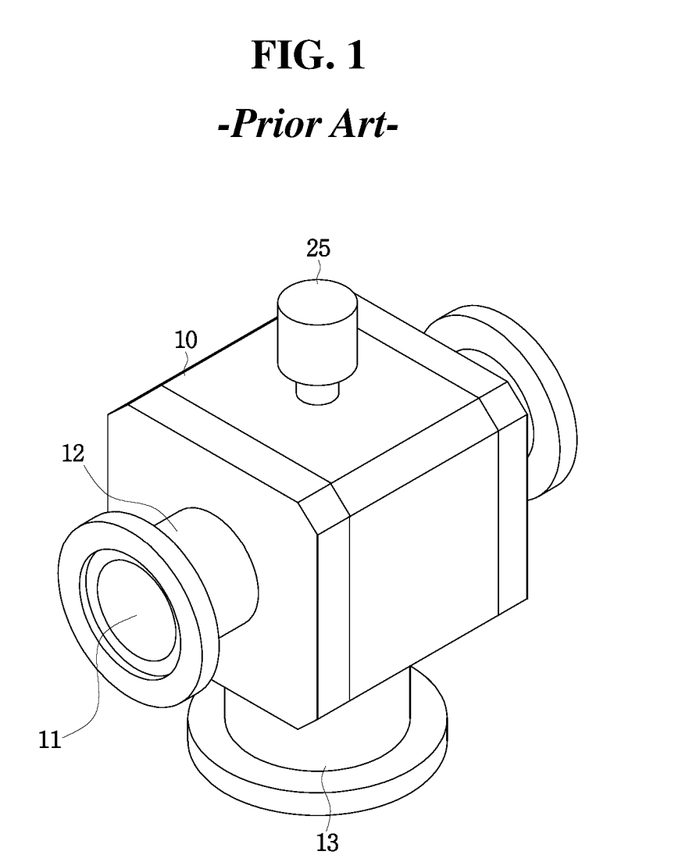
FIGS. 1 and 2 are reference views for describing a conventional three-way valve.
Figure 2:
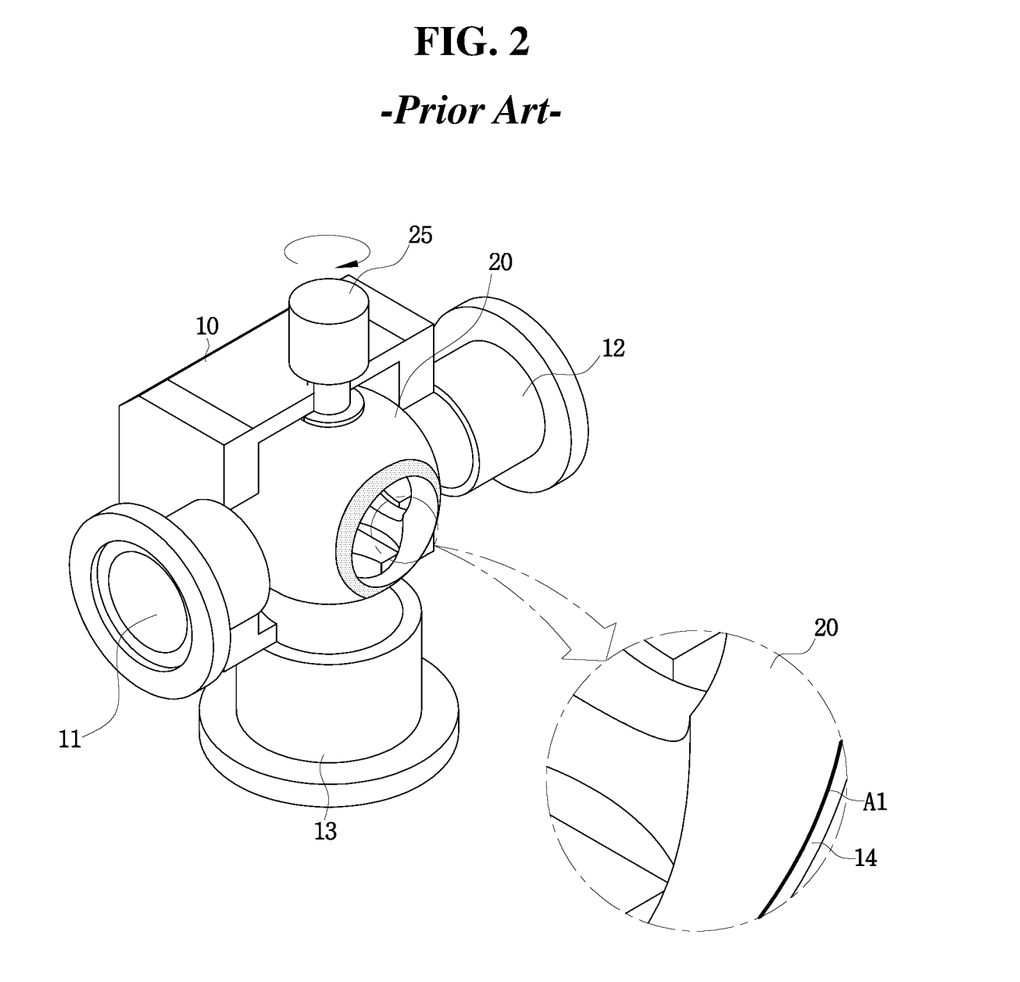

Vacuum pumps and scrubbers which are gas treatment apparatuses are used to perform processes in such a semiconductor and flat panel display production lines, and lines which connect the vacuum pumps and the scrubbers are called exhaust lines. Three-way valves illustrated in FIGS. 1 and 2 are being widely used in the exhaust lines to control a flow direction of the reaction by-product gas and to efficiently use the scrubbers.

The three-way valve includes a casing 10 having an inlet 13 through which reaction by-product gas is introduced and a plurality of outlets 11 and 12 through which the reaction by-product gas is discharged, and a rotating ball 20 disposed in the casing 10 and configured to rotate according to rotation of a rotating shaft 25 to control a flow of the reaction by-product gas.

However, when the three-way valve used in the exhaust line in which a great deal of powder is generated is used for a predetermined time period, there is a problem in that the powder contained in the reaction by-product gas is introduced into a gap A1 between the rotating ball 20 and a ball seat 14 supporting the rotating ball 20 and is accumulated such that the rotating ball 20 is difficult to operate. Particularly, since the powder tends to be strongly introduced into the gap between the rotating ball 20 and the ball seat 14 through a non-communication state outlet hole, which does not communicate with the outlets 11 and 12 of the casing 10, of two outlet holes formed in the rotating ball 20, a solution to solve the problem is needed.

SUMMARY

The present invention is directed to providing a powder protecting three-way valve which prevents a powder from being introduced into a gap between a rotating ball and a ball seat by supplying nitrogen gas in an air curtain form heated in an exhaust line of a semiconductor or flat panel display manufacturing apparatus so that the powder protecting three-way valve is usable for a long time period without damage and in which a member configured to heat and supply nitrogen gas is integrally and compactly provided instead of being separately provided as an independent member and an additional installation space is not needed.

One aspect of the present invention provides a powder protecting three-way valve including a valve casing including an inlet through which reaction by-product gas is introduced and a plurality of outlets through which the introduced reaction by-product gas is discharged in different directions, a rotating ball rotatably installed in the valve casing to control a flow direction of the reaction by-product gas, a nitrogen gas supply member which receives nitrogen gas from an outside, guides a flow of the nitrogen gas using a guide path, and supplies the nitrogen gas into the valve casing to prevent a powder contained in the reaction by-product gas from accumulating in the valve casing, and a heating unit installed in the nitrogen gas supply member to heat the nitrogen gas passing through an interior of the nitrogen gas supply member, wherein the nitrogen gas supply member is formed as a thin flat body pressed against one side surface of the valve casing and is integrally coupled to the valve casing.

In this case, the guide path of the nitrogen gas supply member may be formed in a spiral shape in which a radius is gradually decreased to increase a heating time of the heating unit.

In addition, the heating unit may be installed with a partition disposed between the heating unit and the guide path in the nitrogen gas supply member and have a width which covers a region in which the guide path is formed so that the nitrogen gas is continuously heated while flowing along the guide path.

The nitrogen gas supply member may include a cartridge slit which is installed with a partition disposed between the cartridge slit and the guide path inside the nitrogen gas supply member and have a width which covers a region in which the guide path is formed and including an inlet port which is open toward one side circumferential surface of a main body of the nitrogen gas supply member, and the heating unit may include a detachable surface heating unit having a thin film form and inserted into and installed in the cartridge slit through the open inlet port of the cartridge slit.

The heating unit may be formed to have a quadrilateral plate shape inserted into the slit and include an interference avoiding groove which is open to extend from an end portion of a circumference of the heating unit to a central portion of the heating unit to avoid interference with a nitrogen gas spray portion formed in a central portion of the guide path when inserted into the cartridge slit of the nitrogen gas supply member.

The rotating ball may include an inlet hole which corresponds to and communicates with the inlet of the valve casing and a plurality of outlet holes which correspond to the plurality of outlets of the valve casing and selectively communicate with any one of the plurality of outlets according to a rotating direction of the rotating ball to control a flow of the reaction by-product gas in the valve casing, wherein the outlet of the valve casing and a non-communication state outlet hole of the plurality of outlet holes may be formed to face one side surface of the valve casing, and the nitrogen gas supply member may guide the nitrogen gas to flow through the non-communication state outlet hole, which faces the one side surface of the valve casing, of the plurality of outlet holes of the rotating ball so that the nitrogen gas passing through the non-communication state outlet hole may serve as an air curtain which blocks the powder contained in the reaction by-product gas from being introduced into a gap between a ball seat of the valve casing positioned adjacent to a circumferential portion of the non-communication state outlet hole and the rotating ball.

A circular opening corresponding to the non-communication state outlet hole of the rotating ball may be formed in one side wall of the valve casing, and a guide disc may be installed in the circular opening to form a gap between the guide disc and an inner circumferential surface of the circular opening so that the nitrogen gas sprayed from the nitrogen gas supply member may be dispersed after coming into contact with a front side surface of the guide disc and pass through the non-communication state outlet hole of the rotating ball while flowing in an air curtain form having a circular pipe shape along a circumferential portion of the guide disc.

In addition, a uniform gas spray portion which protrudes to have a conical shape and comes into contact with the nitrogen gas sprayed from the nitrogen gas supply member to disperse the nitrogen gas therearound may be further formed in a central portion of the front side surface of the guide disc.

According to embodiments of the present invention, since a powder protecting three-way valve supplies nitrogen gas in an air curtain form heated in an exhaust line of a semiconductor or flat panel display manufacturing apparatus to prevent a powder from being introduced into a gap between a rotating ball and a ball seat, the powder protecting three-way valve can be used for a long time period without damage.

In addition, since a member configured to heat and supply the nitrogen gas has a flat body and is integrally and compactly provided instead of being additionally and independently provided, an additional installation space is not needed.

DETAILED DESCRIPTION

A powder protecting three-way valve according embodiments of the present invention will be described in detail with reference to the accompanying drawings. Since the present invention allows various changes and numerous embodiments, specific embodiments will be illustrated in the drawings and described in detail in the written description. However, this is not intended to limit the present invention to the specific embodiments, and it is to be appreciated that all changes, equivalents, and substitutes that do not depart from the spirit and technical scope of the present invention are encompassed in the present invention. Like numbers refer to like elements throughout the description of the figures. In the accompanying drawings, sizes of structures may be greater than those of actual structures for clarity of the present invention or may be smaller than those of the actual structure such that a schematic structure of the present invention is understood.

It will be understood that, although the terms "first," "second," etc. may be used herein to describe various elements, these elements should not be limited by these terms. These terms are only used to distinguish one element from another element. For example, a first element could be termed a second element, and a second element could similarly be termed a first element without departing from the scope of the present invention. Meanwhile, unless otherwise defined, all terms including technical and scientific terms used herein are to be interpreted as is customary in the art to which this invention belongs. It should be further understood that terms in common usage should also be interpreted as is customary in the relevant art and not in an idealized or overly formal sense unless expressly so defined herein.

Figure 3:
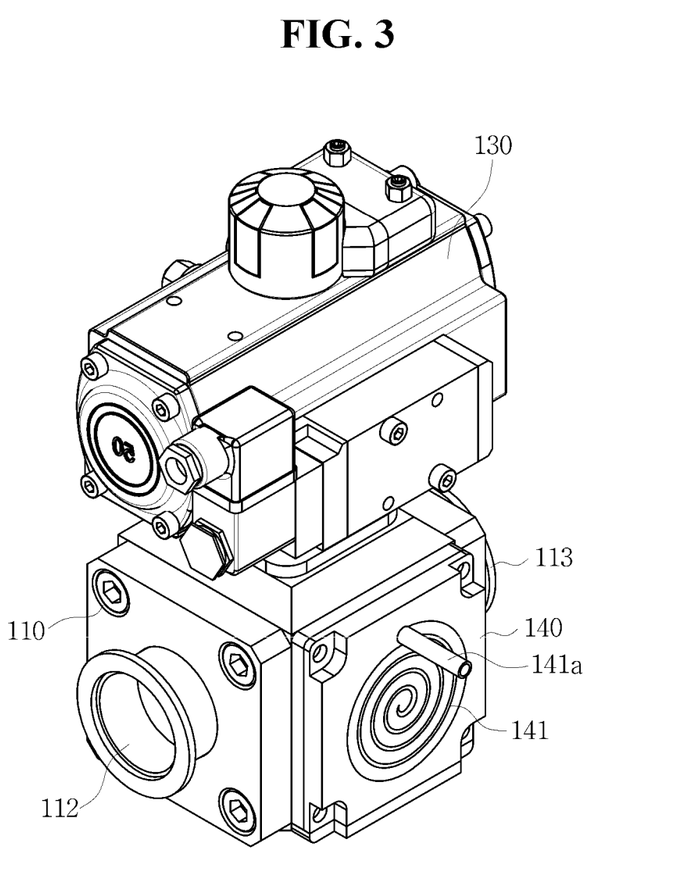
FIG. 3 is a perspective view illustrating a powder protecting three-way valve according to an embodiment of the present invention.
Figure 4:
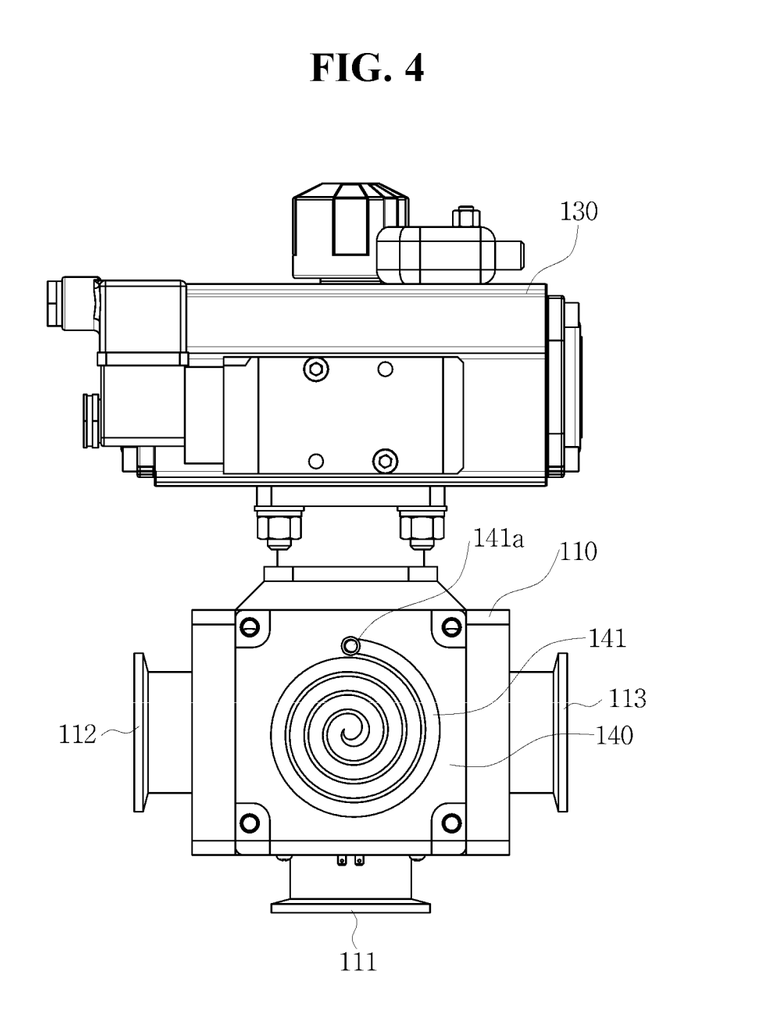
FIG. 4 is a side view illustrating the powder protecting three-way valve according to the embodiment of the present invention.
Figure 5:
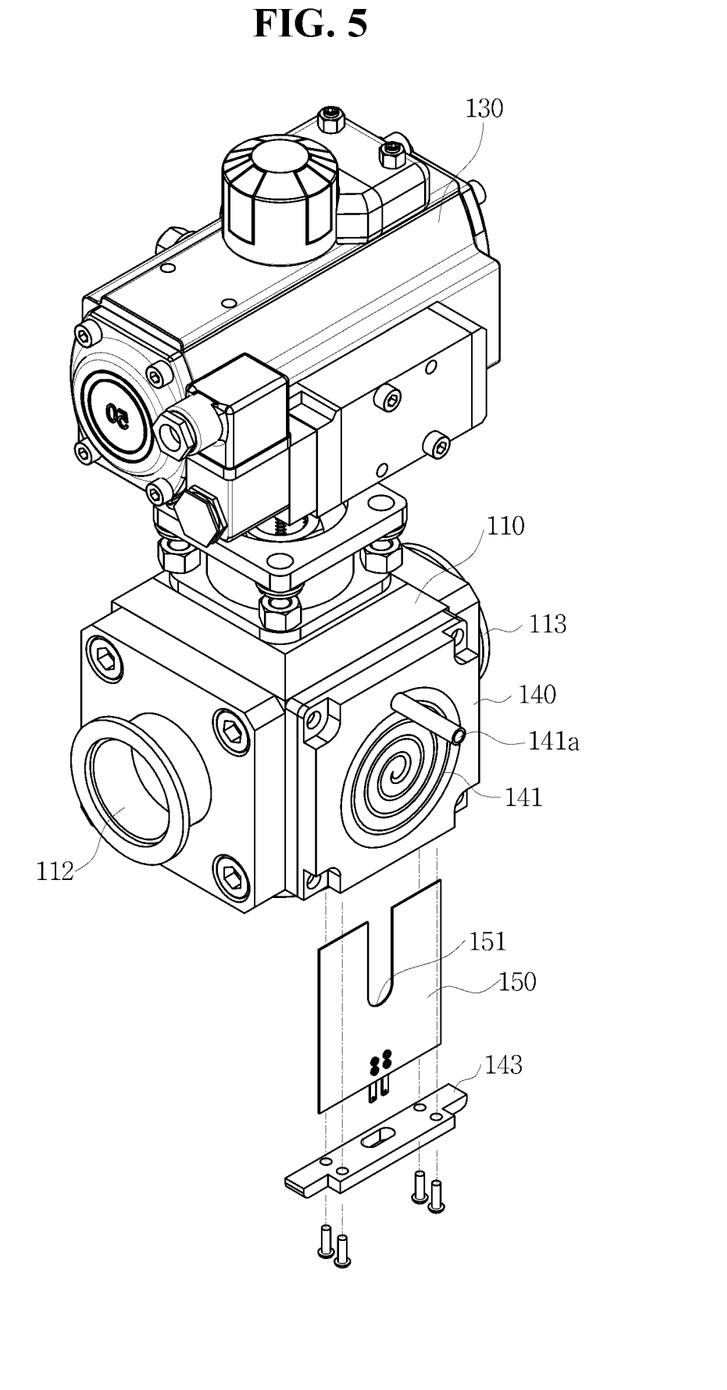
FIG. 5 is a partially exploded perspective view for describing a detachable structure of a heating unit in the powder protecting three-way valve according to the embodiment of the present invention.
Figure 6:
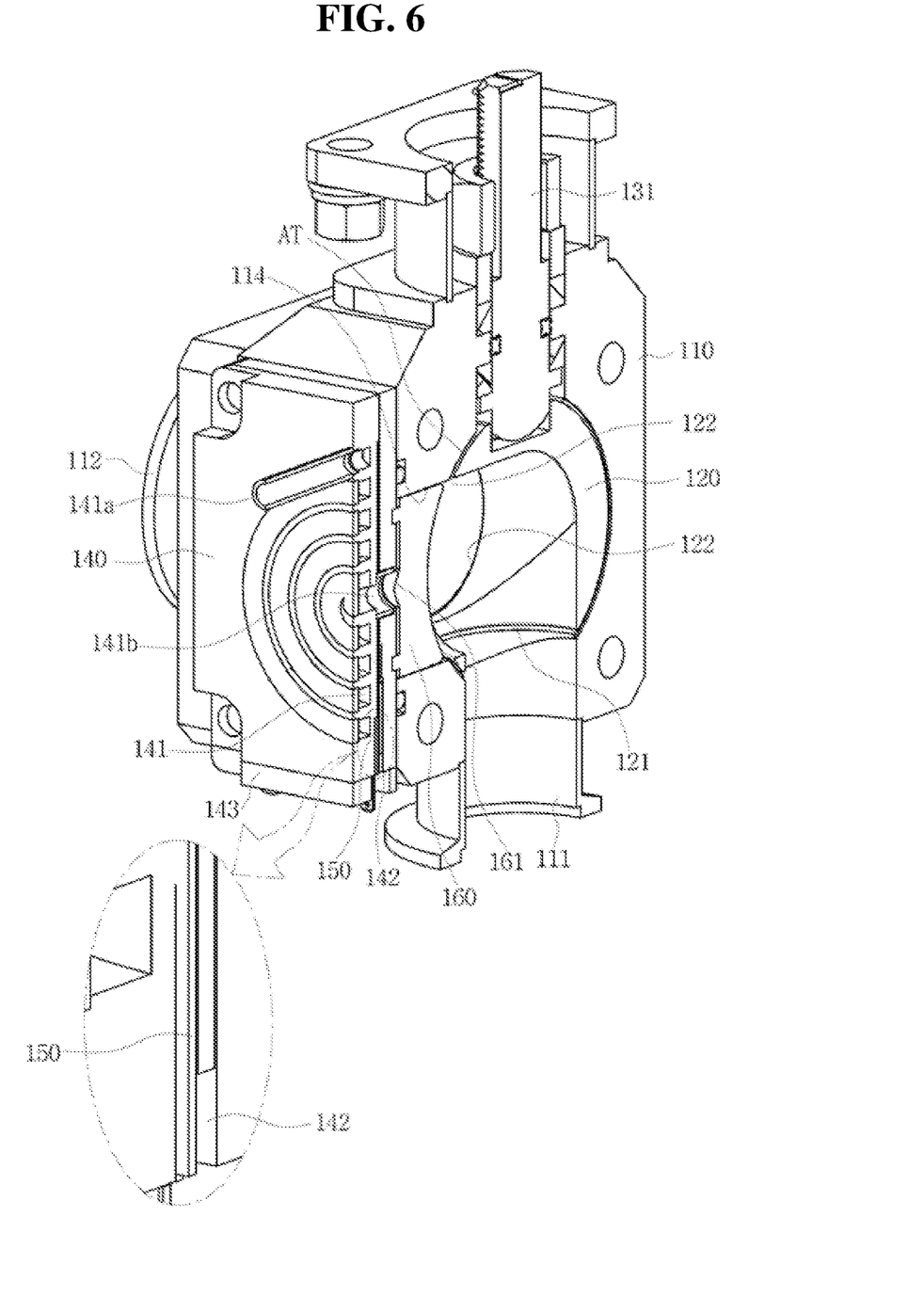
FIGS. 6 and 7 are longitudinal cross-sectional views illustrating the powder protecting three-way valve according to the embodiment of the present invention.
Figure 7:
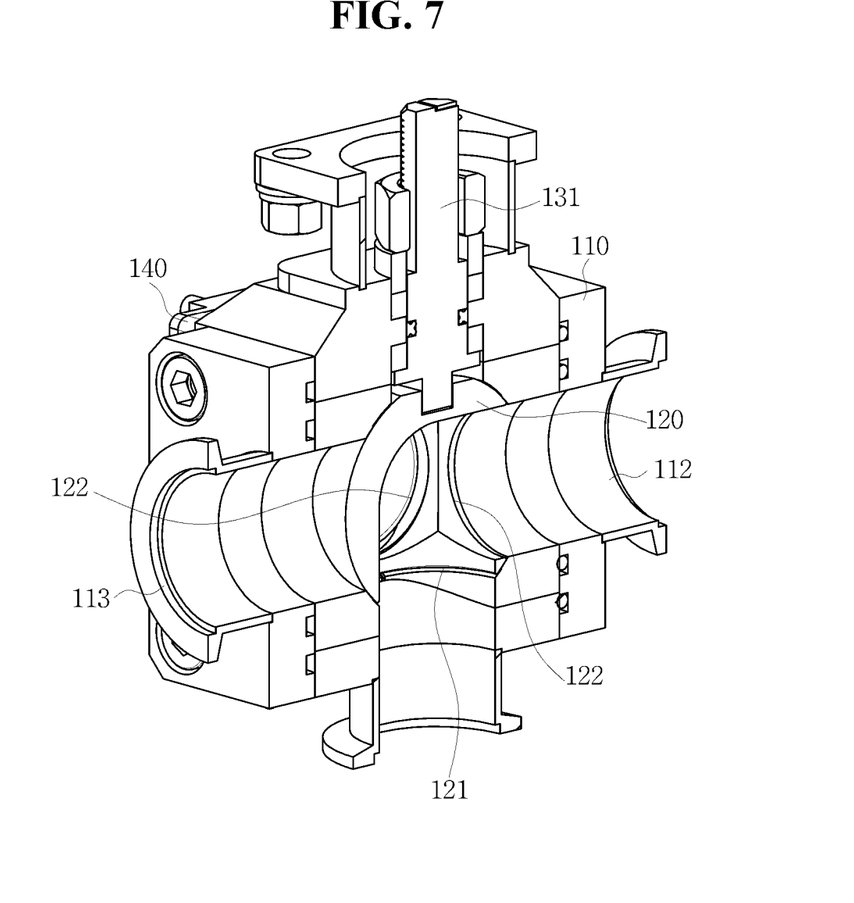
Figure 8:
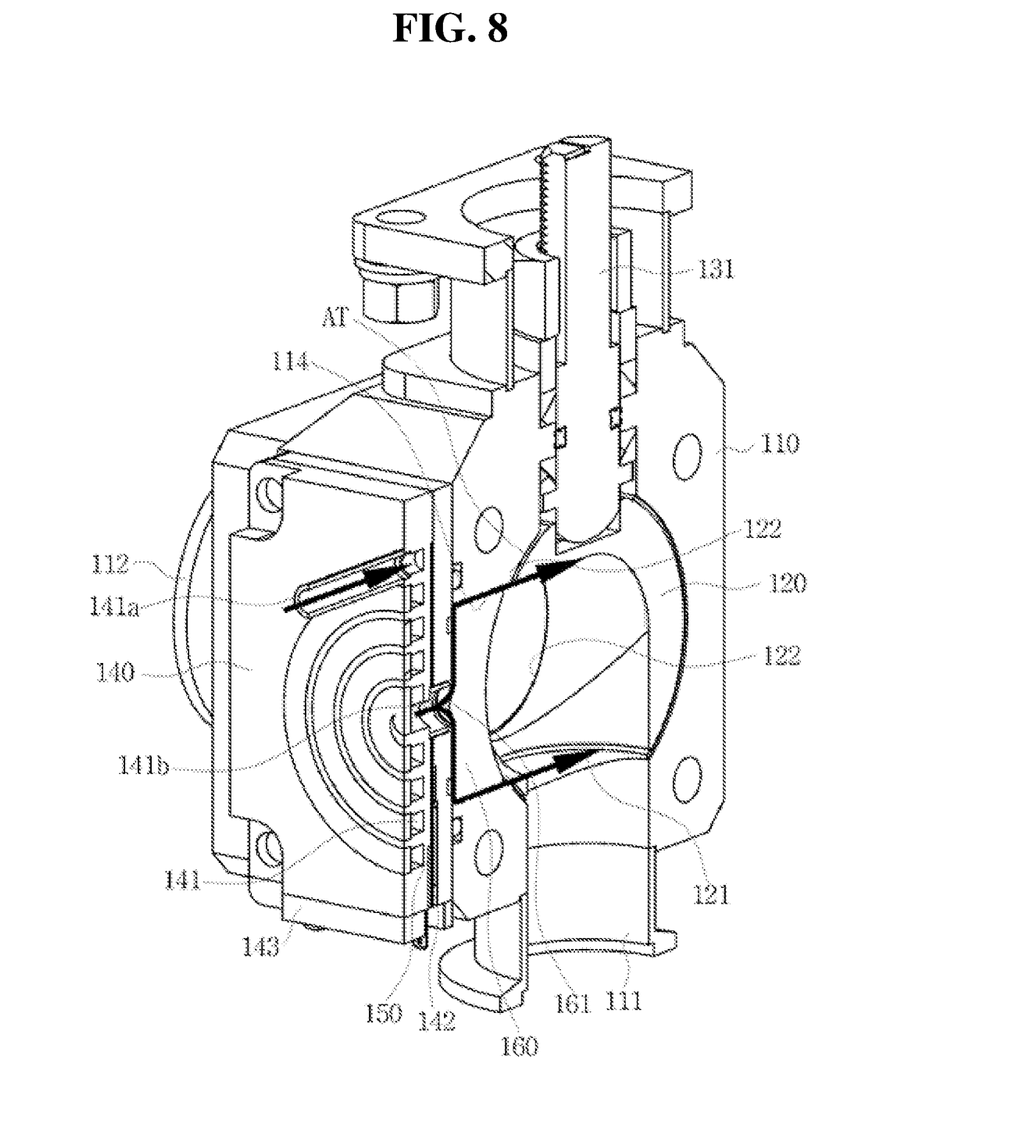
FIG. 8 is a reference cross-sectional view for describing an internal flow of nitrogen gas in the powder protecting three-way valve according to the embodiment of the present invention.
Figure 9:
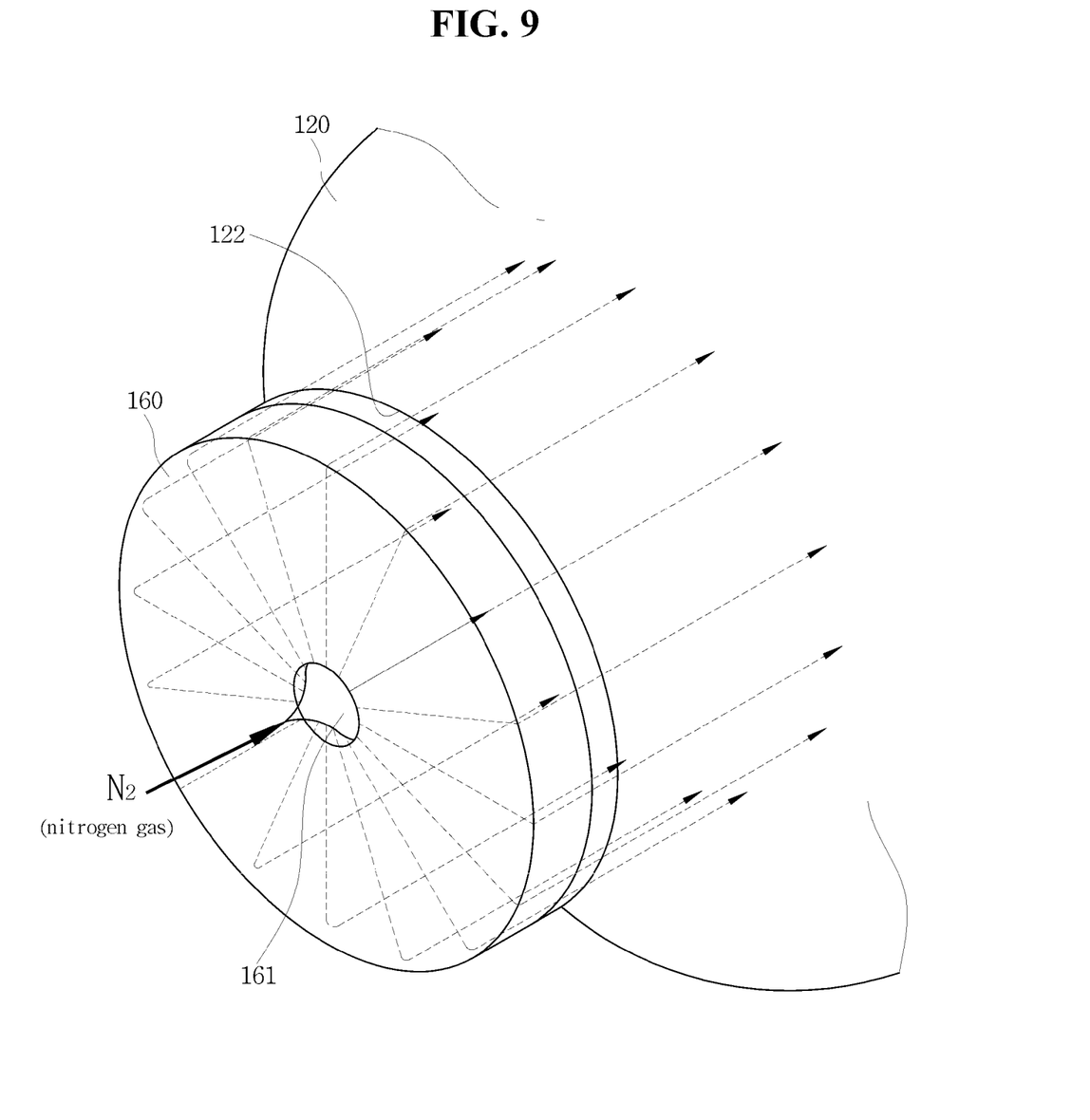
FIG. 9 is a reference view for describing the nitrogen gas formed in an air curtain form due to a guide disc in the powder protecting three-way valve according to the embodiment of the present invention.

FIG. 3 is a perspective view illustrating a powder protecting three-way valve according to an embodiment of the present invention, FIG. 4 is a side view illustrating the powder protecting three-way valve according to the embodiment of the present invention, FIG. 5 is a partially exploded perspective view for describing a detachable structure of a heating unit in the powder protecting three-way valve according to the embodiment of the present invention, FIGS. 6 and 7 are longitudinal cross-sectional views illustrating the powder protecting three-way valve according to the embodiment of the present invention, FIG. 8 is a reference cross-sectional view for describing an internal flow of nitrogen gas in the powder protecting three-way valve according to the embodiment of the present invention, and FIG. 9 is a reference view for describing the nitrogen gas formed in an air curtain form due to a guide disc in the powder protecting three-way valve according to the embodiment of the present invention.

As illustrated in the drawings, the powder protecting three-way valve according to the embodiment of the present invention includes a valve casing 110, a rotating ball 120, and an actuator 130, and further includes a nitrogen gas supply member 140, a heating unit 150, and a guide disc 160 as main components which heat nitrogen gas at a high temperature and supply the nitrogen gas into the valve casing 110.

Due to such a structure according to the present invention in which the nitrogen gas supply member 140, the heating unit 150, and the guide disc 160 are additionally provided, heated nitrogen gas is mixed with reaction by-product gas such that the reaction by-product gas is not solidified, the nitrogen gas serves as an air curtain to block a powder from being introduced into a gap between the rotating ball 120 and a ball seat of the valve casing 110 when the nitrogen gas is supplied, and the components have a unique structure integrally provided to have a flat plate shape on one side surface of the valve casing 110 without being additionally and independently provided so that a compact product can be realized which does not require an additional installation space.

Hereinafter, the powder protecting three-way valve including the main components according to the embodiment of the present invention will be described in more detail.

The valve casing 110 includes an inner space accommodating the rotating ball 120, an inlet 111 through which the reaction by-product gas is introduced and a plurality of outlets 112 and 113 through which the introduced reaction by-product gas is discharged in different directions with respect to the inner space. In addition, the inlet 111 and the outlets 112 and 113 include flanges to be connected to other pipes. In this case, the ball seat rotatably supporting the rotating ball 120 is provided on an inside of walls of the valve casing 110. In addition, a circular opening 114 corresponding to a non-communication state outlet hole 122 of the rotating ball 120 is formed in one side wall of the walls of the valve casing 110. The circular opening 114 is a passage through which the nitrogen gas supplied from the nitrogen gas supply member 140 is received in the valve casing 110.

The rotating ball 120 is rotatably installed in the inner space of the valve casing 110 to perform a function of controlling a flow direction of the reaction by-product gas. To this end, the rotating ball 120 includes one inlet hole 121 which normally communicates with the inlet 111 of the valve casing 110 and a plurality of outlet holes 122 which correspond to the plurality of outlets 112 and 113 included in the valve casing 110 and selectively communicate with any one of the plurality of outlets 112 and 113 according to a rotating direction of the rotating ball 120. Accordingly, the rotating ball 120 connected to a rotating shaft 131 of the actuator 130 rotates to control the flow direction of the reaction by-product gas by performing a function of selectively closing or opening any one of the plurality of outlets 112 and 113 formed in the valve casing 110 according to a rotating angle of the rotating ball 120. Since the rotating ball 120 is substantially the same as that of a conventional technology, the detailed description thereof will be omitted. However, the rotating ball 120 included in the powder protecting three-way valve according to the embodiment of the present invention has few problems due to a solidified powder introduced into the gap between the rotating ball 120 and the ball seat of the valve casing 110 and accumulated in the gap such that the rotating ball 120 is damaged or enters an inoperative state. This is because the high temperature nitrogen gas is introduced into the valve casing 110 from the nitrogen gas supply member 140 through the non-communication state outlet hole 122 of the outlet holes 122 of the rotating ball 120 to serve as the air curtain which blocks the powder of the reaction by-product gas from being introduced into the gap between the rotating ball 120 and the ball seat in the non-communication state outlet hole 122. This will be described in more detail below.

The nitrogen gas supply member 140 serves to receive nitrogen gas from the outside and guides the nitrogen gas to flow inward. To this end, the nitrogen gas supply member 140 includes a guide path 141 configured to guide a flow of nitrogen gas, and the guide path 141 is formed to have a spiral shape in which a radius is gradually decreased as illustrated in the drawings. When the nitrogen gas supply member 140 includes the guide path 141 having the spiral shape as described above, a heating time of the heating unit 150 for heating nitrogen gas is increased so that heating efficiency can be improved. In this case, an inlet portion 141a connected to an external transfer pipe to receive nitrogen gas is positioned at an end portion positioned at a circumferential portion of the guide path 141, and a spray portion 141b configured to spray nitrogen gas into the valve casing 110 through the non-communication state outlet hole 122 of the rotating ball 120 is positioned at an end portion positioned at a central portion of the guide path 141.

A notable point in this case is that nitrogen gas is supplied through the non-communication state outlet hole 122 of the rotating ball 120 when the nitrogen gas supply member 140 supplies the nitrogen gas into the valve casing 110 through the guide path 141. Accordingly, a trend in which the reaction by-product gas is intensively introduced into the gap between the ball seat of the valve casing 110 and the rotating ball 120 at a position at which the non-communication state outlet hole 122 of the rotating ball 120 is positioned is prevented by the nitrogen gas passing through the non-communication state outlet hole 122. In this case, the nitrogen gas passing through the non-communication state outlet hole 122 of the rotating ball 120 serves as the air curtain which blocks the reaction by-product gas from being introduced into the gap between the ball seat of the valve casing 110 and the rotating ball 120.

In addition, the guide disc 160 maximizes the role of an air curtain of such nitrogen gas. As illustrated in FIG. 6, the guide disc 160 is installed in the circular opening 114 formed to correspond to the non-communication state outlet hole 122 of the rotating ball 120 in one side wall of the valve casing 110. In this case, the guide disc 160 is provided to have a size slightly smaller than a size perfectly matching the circular opening 114 so that a fine gap is formed between an inner circumferential surface of the circular opening 114 and an outer circumferential surface of the guide disc 160. Accordingly, as illustrated in FIGS. 8 and 9, nitrogen gas sprayed from the nitrogen gas supply member 140 is dispersed after coming into contact with a front side surface of the guide disc 160 and passes through a circumferential portion of the non-communication state outlet hole 122 of the rotating ball 120 while flowing in an air curtain form having a circular pipe shape along a circumferential portion of the guide disc 160. In this case, a uniform gas spray portion 161 which protrudes in a conical shape and serves to come into contact with the nitrogen gas sprayed from the nitrogen gas supply member 140 so as to uniformly disperse the nitrogen gas therearound is further formed in a central portion of the front side surface of the guide disc 160. Due to the structure in which the guide disc 160 is provided, the nitrogen gas flows in a circular pipe shape at a relatively high speed along the circumferential portion of the non-communication state outlet hole 122 of the rotating ball 120 to more strongly block the reaction by-product gas from being introduced into the gap between the ball seat of the valve casing 110 and the rotating ball 120.

The heating unit 150 is installed in the nitrogen gas supply member 140 to perform a function of heating nitrogen gas passing through an interior of the nitrogen gas supply member 140. To this end, the heating unit 150 is installed in the nitrogen gas supply member 140 and provided to have a quadrilateral plate shape having a width which covers an entire region in which the guide path 141 is formed, wherein a partition is disposed between the heating unit 150 and the guide path 141. In addition, the heating unit 150 includes an interference avoiding groove 151 which is open to extend from an end portion of a circumference of the heating unit 150 to a central portion of the heating unit 150 to prevent interference with the nitrogen gas spray portion 141*b* formed on the central portion of the guide path 141. The heating unit 150 having such a structure continuously heats nitrogen gas while the nitrogen gas flows along the guide path 141 having the spiral shape.

In addition, as illustrated in FIG. 6, since the heating unit 150 is provided as a detachable surface heating unit having a thin film form, a thickness of the nitrogen gas supply member 140 can be minimized, and installation and replacement of the nitrogen gas supply member 140 can be convenient. A cartridge slit 142 corresponding to the detachable structure of the heating unit 150 is formed in the nitrogen gas supply member 140, has a width which covers a region in which the guide path 141 is formed, and includes an inlet port which is open toward one side circumferential surface of a main body of the nitrogen gas supply member 140, wherein a partition is disposed between the cartridge slit 142 and the guide path 141. Accordingly, the detachable heating unit 150 having the thin film form is inserted into and installed in the cartridge slit 142 through the open inlet port of the cartridge slit 142. For reference, as illustrated in FIG. 5, a slit cover 143 which covers the inlet port of the cartridge slit 142 in a state in which the heating unit 150 is installed may be provided.

Although the exemplary embodiments and other embodiments have been described, the present invention may be variously changed and modified and may include equivalents. It is clear that the embodiments may be suitably modified and similarly applied to the present invention. Accordingly, the above-described contents are not to be limited by the scope of the present invention but defined by the following claims.

The invention claimed is:

1. A powder protecting three-way valve installed in a line of a semiconductor or flat panel display manufacturing apparatus to control a flow of reaction by-product gas containing a powder, the powder protecting three-way valve comprising:
a valve casing including an inlet through which the reaction by-product gas is introduced and a plurality of outlets through which the introduced reaction by-product gas is discharged in different directions;
a rotating ball rotatably installed in the valve casing to control a flow direction of the reaction by-product gas;
a nitrogen gas supply member which receives nitrogen gas from an outside, guides a flow of the nitrogen gas using a guide path, and supplies the nitrogen gas into the valve casing to prevent the powder contained in the reaction by-product gas from accumulating in the valve casing; and
a heater installed in the nitrogen gas supply member to heat the nitrogen gas passing through an interior of the nitrogen gas supply member,
wherein the nitrogen gas supply member is formed as a thin flat body pressed against one side surface of the valve casing and is integrally coupled to the valve casing.

2. The powder protecting three-way valve of claim 1, wherein the guide path of the nitrogen gas supply member is formed in a spiral shape in which a radius is gradually decreased to increase a heating time of the heater.

3. The powder protecting three-way valve of claim 2, wherein the heater is installed with a partition disposed between the heater and the guide path in the nitrogen gas supply member and has a width which covers a region in which the guide path is formed so that the nitrogen gas is continuously heated while flowing along the guide path.

4. The powder protecting three-way valve of claim 2, wherein:
the nitrogen gas supply member includes a cartridge slit which is installed with a partition disposed between the cartridge slit and the guide path inside the nitrogen gas supply member and has a width which covers a region in which the guide path is formed and including an inlet port which is open toward one side of a circumferential surface of a main body of the nitrogen gas supply member; and
the heater includes a detachable surface heater having a thin film form and inserted into and installed in the cartridge slit through the open inlet port of the cartridge slit.

5. The powder protecting three-way valve of claim 4, wherein the heater is formed to have a quadrilateral plate shape inserted into the slit and includes an interference avoiding groove which is open to extend from an end portion of a circumference of the heater to a central portion of the heater to avoid interference with a nitrogen gas spray portion formed in a central portion of the guide path when inserted into the cartridge slit of the nitrogen gas supply member.

6. The powder protecting three-way valve of claim 1, wherein the rotating ball includes an inlet hole which corresponds to and normally communicates with the inlet of the valve casing and a plurality of outlet holes which correspond to the plurality of outlets of the valve casing and selectively communicate with any one of the plurality of outlets according to a rotating direction of the rotating ball to control a flow of the reaction by-product gas in the valve casing,
wherein the outlet of the valve casing and a non-communication state outlet hole of the plurality of outlet holes are formed to face one side surface of the valve casing; and
the nitrogen gas supply member guides the nitrogen gas to flow through the non-communication state outlet hole, which faces the one side surface of the valve casing, of the plurality of outlet holes of the rotating ball so that the nitrogen gas passing through the non-communication state outlet hole serves as an air curtain which blocks the powder contained in the reaction by-product gas from being introduced into a gap between a ball seat of the valve casing positioned adjacent to a circumferential portion of the non-communication state outlet hole and the rotating ball.

7. The powder protecting three-way valve of claim 6, wherein:

a circular opening corresponding to the non-communication state outlet hole of the rotating ball is formed in one side wall of the valve casing; and a guide disc is installed in the circular opening to form a gap between the guide disc and an inner circumferential surface of the circular opening so that the nitrogen gas sprayed from the nitrogen gas supply member is dispersed after coming into contact with a front side surface of the guide disc and passes through the non-communication state outlet hole of the rotating ball while flowing in an air curtain form having a circular pipe shape along a circumferential portion of the guide disc.

8. The powder protecting three-way valve of claim 7, wherein a uniform gas spray portion which protrudes to have a conical shape and comes into contact with the nitrogen gas sprayed from the nitrogen gas supply member to disperse the nitrogen gas therearound is further formed in a central portion of the front side surface of the guide disc.

\* \* \* \* \*